United States Patent
Kubota et al.

(10) Patent No.: US 6,270,393 B1
(45) Date of Patent: Aug. 7, 2001

(54) ABRASIVE SLURRY AND PREPARATION PROCESS THEREOF

(75) Inventors: Toshio Kubota; Tsutomu Yamada, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/410,048

(22) Filed: Oct. 1, 1999

(30) Foreign Application Priority Data

Oct. 5, 1998 (JP) .................................................. 10-296232

(51) Int. Cl.⁷ ...................................................... B24B 1/00
(52) U.S. Cl. .................................. 451/36; 450/41; 51/304
(58) Field of Search ....................... 51/304, 307; 216/88, 216/89; 451/36, 41

(56) References Cited

U.S. PATENT DOCUMENTS

| | | | |
|---|---|---|---|
| 4,956,015 | * | 9/1990 | Okajima et al. .......................... 51/309 |
| 6,039,775 | * | 3/2000 | Ho et al. .................................. 51/295 |

FOREIGN PATENT DOCUMENTS

| | | |
|---|---|---|
| 8-96237 | 4/1996 | (JP) . |
| 9-54914 | 2/1997 | (JP) . |

\* cited by examiner

Primary Examiner—Timothy V. Eley
(74) Attorney, Agent, or Firm—Oliff & Berridge, PLC

(57) ABSTRACT

An abrasive slurry contains an alumina grain, an inorganic salt, a water-soluble chelating agent, an abrasive oil and a hardly water-soluble chelate aluminum salt or chelate nickel salt. The alumina grain has an average particle diameter of from 0.05 to 1 μm in an amount of from 0.1 to 10% by weight. The inorganic salt is selected from the group consisting of water-soluble inorganic aluminum salt and nickel salt in an amount of from 0.1 to 3% by weight. The content of the water-soluble chelating agent is from 0.1 to 3% by weight. The content of the abrasive oil is from 0.1 to 10% by weight. The content of the hardly water-soluble chelate aluminum salt or chelate nickel salt is not more than 0.1% by weight. The abrasive slurry is used for abrading an insulation layer of a semiconductor integrated circuit and a magnetic thin film head while they are produced.

12 Claims, 2 Drawing Sheets

ABRASIVE SLURRY AND PREPARATION PROCESS THEREOF

BACKGROUND OF THE INVENTION

1. Field of the Invention

The present invention relates to an abrasive slurry and a preparation process of the abrasive slurry, which is suitable for the abrasion of thin film magnetic head for use in a hard disc drive (HDD), (particularly composite thin film magnetic head), a semiconductor integrated circuit, etc.

2. Description of the Related Art

With the enhancement of the recording capacity of HDD, the recent trend is more composite thin film magnetic heads performing magnetic induction writing by "write-inductive-element" and magnetic resistance reading by "read-MR-element" in combination (so-called MR head) to be used than magnetic induction thin film magnetic heads.

Under the circumstances, the surface roughness of the substrate on which MR elements are to be formed has been noted as a property governing the characteristics of magnetic resistance element (MR element) made of thin film laminate. JP-A-9-54914 (The term "JP-A" as used herein means an "unexamined Japanese patent publication (kokai)" ) proposes that the surface of alumina as underlayer of MR be slightly abraded.

Further, JP-A-8-96237 proposes that abrasion be conducted to eliminate undulation on the surface of upper shield due to the difference of thickness of substrate layer and the final step of abrasion involve the abrasion of $Al_2O_3$ and NiFe.

These conventional art techniques disclose that abrasion can be used as a method for creating surface. However, it is necessary that the composite thin film magnetic head, e.g., alumina as insulating layer and NiFe constituting the magnetic circuit be abraded at the same time. There is no specific disclosure concerning an abrasive slurry which can be used to perform abrasion satisfying the requirements that the difference in the level between the two components be kept to not more than 1,000 Å while keeping the surface roughness Max of not more than 100 Å and Ra of not more than 10 Å.

SUMMARY OF THE INVENTION

It is an object of the present invention to provide an abrasive slurry for use in the leveling abrasion in the course of the formation of a thin film magnetic head, a semiconductor integrated circuit, etc., which can satisfy the requirements for surface roughness of composite material and is adapted to keep the difference in the level between different materials.

The present invention provides a process for preparation of an abrasive slurry, comprises the steps of: preparing a solution of an inorganic salt selected from the group consisting of water-soluble inorganic aluminum salt and nickel salt and a solution of water-soluble chelating agent; mixing the two solutions; holding the mixed solution for 1 day or longer to precipitate hardly water-soluble crystal; removing the hardly water-soluble crystal from the solution; and mixing the solution with an alumina grain having an average particle diameter of from 0.05 to 1 μm, an abrasive oil and a required amount of an aqueous dispersant.

Thus, an abrasive slurry according to the present invention comprises: an alumina grain having an average particle diameter of from 0.05 to 1 μm in an amount of from 0.1 to 10% by weight; an inorganic salt selected from the group consisting of water-soluble inorganic aluminum salt and nickel salt in an amount of from 0.1 to 3% by weight; a water-soluble chelating agent in an amount of from 0.1 to 3% by weight; an abrasive oil in an amount of from 0.1 to 10% by weight; and a hardly water-soluble chelate aluminum salt or chelate nickel salt of not more than 0.1% by weight. The abrasive slurry is used for abrading an insulation layer of a semiconductor integrated circuit and a magnetic thin film head while they are produced.

The abrasive slurry according to the present invention comprises a hardly water-soluble chelate aluminum salt or chelate nickel salt causing scratch incorporated therein in a limited amount of not more than 0.1% by weight even after one month of holding after preparation. Accordingly, alumina and NiFe in composite magnetic heads abraded with the abrasive slurry according to the present invention are not found microscratched. Further, the use of an abrasive grain having an average particle diameter of from 0.05 to 1 μm makes it possible to improve the flatness of the surface of Wf.

The present invention further provides a process for abrading a thin film abraded by an abrasive slurry comprising: an alumina grain having an average particle diameter of from 0.05 to 1 μm in an amount of from 0.1 to 10% by weight; an inorganic salt selected from the group consisting of water-soluble inorganic aluminum salt and nickel salt in an amount of from 0.1 to 3% by weight; a water-soluble chelating agent in an amount of from 0.1 to 3% by weight; and an abrasive oil in an amount of from 0.1 to 10% by weight; wherein a content of said hardly water-soluble chelate aluminum salt or chelate nickel salt in said water-soluble abrasive slurry is not more than 0.1% by weight. This process can be applied to a process for abrading a semiconductor integrated circuit, a process for abrading a magnetic thin film head, and the like.

Incidentally, in the present invention, the term of "abrade" includes polish, grind, whet and the like. For example, CMP (Chemical Mechanical Polishing) is one of polishing methods.

DETAILED DESCRIPTION OF THE INVENTION

Figure 1A:
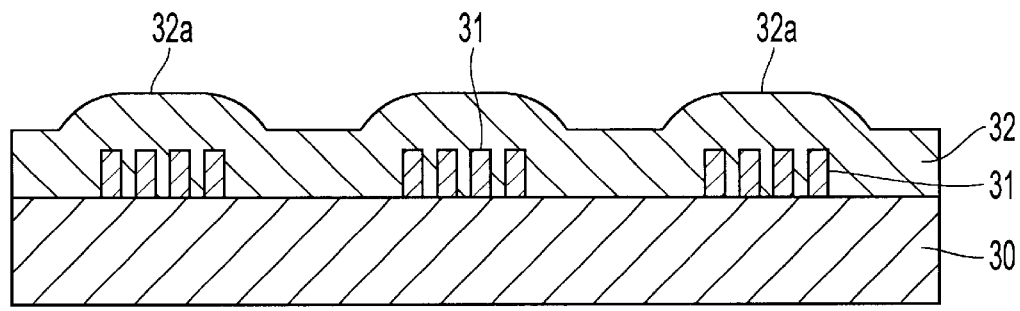
FIGS. 1A and 1B are cross sectional views showing an embodiment of flatting process of a multi-layered wiring of a semiconductor integrated circuit by using the abrasive slurry according to the present invention.

The present invention will be described in detail with reference to the accompanying drawings as follows.

Preparation of Abrasive Slurry:

Referring to the preparation of the abrasive slurry according to the present invention, a solution of an inorganic salt (b) selected from the group consisting of water-soluble inorganic aluminum salt and nickel salt and a solution of water-soluble chelating agent (c) are prepared. The two solutions are mixed to cause the precipitation of crystal in water. For example, the mixture is held for 1 day or more, preferably 1 to 7 days to cause the precipitation. The crystal thus precipitated was then removed by filtration, decantation or the like. The solution is then mixed with an alumina grain (a) having an average particle diameter of from 0.05 to 1 μm, an abrasive oil (d) and optionally a required amount of an aqueous dispersant to thereby obtain an aqueous abrasive slurry containing an alumina grain (a) having an average particle diameter of from 0.05 to 1 μm in an amount of from 0.1 to 10% by weight, an inorganic salt (b) selected from the group consisting of water-soluble inorganic aluminum salt and nickel salt in an amount of from 0.1 to 3% by weight, a water-soluble chelating agent (c) in an amount of from 0.1 to 3% by weight and an abrasive oil (d) in an amount of from 0.1 to 10% by weight. In the aqueous abrasive slurry according to the present invention, the content of hardly water-soluble chelate aluminum salt or chelate nickel salt in the water-soluble abrasive slurry is not more than 0.1% by weight.

The amount of the hardly water-soluble chelate salt in the abrasive slurry is not more than 0.1% by weight, preferably not more than 0.01% by weight.

The abrasive slurry according to the present invention contains a hardly water-soluble chelate aluminum salt or chelate nickel salt causing scratch incorporated therein in a limited amount of not more than 0.1% by weight even after one month of holding after preparation. Accordingly, alumina and NiFe in composite magnetic heads abraded with the abrasive slurry according to the present invention are not found microscratched. Further, the use of an abrasive grain having an average particle diameter of from 0.1 to 1 μm makes it possible to improve the flatness of the surface of Wf.

Object to be Abraded:

The abrasive slurry obtained according to a preparation process of the present invention is used in the leveling abrasion in the course of the formation of a composite magnetic head element, a semiconductor integrated circuit, etc. Examples of such a material to be abraded include a material having alumina as insulation layer, NiFe constituting a magnetic circuit, Cu wiring through which current flows in a magnetic circuit., etc. exposed at the surface thereof alone or in combination.

Abrasive Grain:

As the abrasive grain, there may be used alumina (aluminum oxide) grain, alone or in combination with cerium oxide, single-crystal diamond, polycrystalline diamond, silicon oxide, silicon carbide, chromium oxide or glass powder. These abrasive grains have an average particle diameter of from 0.05 to 1.0 μm, preferably from 0.3 to 0.5 μm.

The amount of the abrasive grain as the component (a) in the abrasive slurry is from 0.1 to 10% by weight, preferably from 0.1 to 3% by weight. If the amount of the abrasive grain falls below 0.05% by weight, a practical abrasion speed cannot be attained. Even if the amount of the abrasive grain exceeds 10% by weight, further enhancement of effect cannot be expected. Thus, the use of excess abrasive slurry is disadvantageous from the economical standpoint of view.

Aqueous Dispersant:

As the dispersion medium, there may be used water alone. Alternatively, a blend of water as a main component (70 to 99% by weight) with a water-soluble organic solvent (e.g., alcohol, glycol) as a subsidiary component (1 to 30% by weight) may be used. As water, there may be preferably used one free of huge particles as much as possible obtained by filtering through, for example, a 0.1 μm cartridge filter. Pores of the filter is preferably as fine as possible. Examples of the alcohol employable herein include methyl alcohol, ethyl alcohol, and isopropyl alcohol. Examples of the glycol employable herein include ethylene glycol, tetramethylene glycol, diethylene glycol, propylene glycol, and polyethylene glycol.

The content of the aqueous dispersant in the abrasive slurry is from 70 to 99% by weight, preferably from 90 to 99% by weight. If the content of the aqueous dispersant falls below 70% by weight, the resulting slurry exhibits a raised viscosity and thus can be hardly supplied onto the substrate and can be unstably stored.

Water-soluble Inorganic Metal Salt:

The water-soluble inorganic aluminum or nickel salt as component (b) acts to enhance the abrasion speed. Examples of such a component (b) include nitrate, hydrochloride, sulfate, phosphate and thiosulfate of aluminum or nickel. Specific examples of these salts include aluminum nitrate, nickel nitrate, and aluminum sulfate. The water-soluble inorganic salt as component (b) is incorporated in the abrasive slurry in an amount of from 0.1 to 3% by weight, preferably, from 0.3 to 1% by weight.

Water-soluble Chelating Agent:

The water-soluble chelating agent as component (c) is incorporated in the slurry for the purpose of enhancing the abrasion speed and the flatness of the wafer thus obtained. Examples of such a water-soluble chelating agent employable herein include ethylenediaminetetraacetic acid (EDTA), disodium ethylene diamine tetraacetate (EDTA-2), alkaline metal salt of aminosulfonic acid-N,N-diacetic acid, alkaline metal salt of 2,2-dimethylpropanebisoxamide, diethylenetriamine pentaacetic acid, and sodium salt thereof. The chelating agent as component (c) is incorporated in the abrasive slurry in an amount of from 0.1 to 3% by weight, preferably, 0.3 to 1% by weight.

Abrasive Oil:

Examples of the abrasive oil to be used as component (d) which acts as an abrasion improver and abrasive grain dispersant include various surfactants, ethylene glycol, propylene glycol, polyethylene glycol, polyoxyethylene alkyl ether, polyoxyethylene alkyl phenyl ether, and pullonic nonionic surfactants (adduct of ethylene oxide and propylene oxide).

Examples of the surfactant employable herein include anionic surfactant, cationic surfactant, nonionic surfactant, amphoteric surfactant, combination of anionic surfactant and nonionic surfactant, combination of anionic surfactant and amphoteric surfactant, combination of cationic surfactant and nonionic surfactant, and combination of cationic surfactant and amphoteric surfactant. The abrasive oil is incorporated in the abrasive slurry in an amount of from 0.1% to 10 by weight, preferably, 1% to 5% by weight.

Anionic Surfactant:

Specific examples of anionic surfactant employable herein include metal soap such as sodium palmitate, sodium stearate, calcium oleate, aluminum stearate and sodium potassium palmitate, alkylpolyoxyethyleneethercarboxylate, alkylphenylpolyoxyethyleneethercarboxylate, sulfated aliphatic acid alkyl ester, monoacyl glycerin sulfate, secondary alkanesulfonate, N-acyl-N-methyltaurate, sodium dodecylbenzenesulfonate, alkyletherphosphoric acid, alkylpolyoxyethylene phosphate, alkylphenylpolyoxyethylene phosphate, sodium naphthalenesulfonate, perfluoroalkyl phosphoric acid ester, and sulfonic acid-modified silicone oil.

Preferred among these anionic surfactants are metal soap, sulfonic anionic surfactant, phosphoric acid ester type anionic surfactant, fluorine-based anionic surfactant and chlorine-based anionic surfactant having HLB of not less than 5, and combination of two or more of these anionic surfactants.

The anionic surfactant is incorporated in the slurry in an amount of from 0.05 to 2% by weight, preferably, 0.5% to 1% by weight. If the amount of the anionic surfactant falls below 0.05% by weight, the resulting abrasive slurry exhibits a deteriorated particle dispersibility and thus is liable to sedimentation of particles. Even if the amount of the anionic surfactant exceeds 2% by weight, further enhancement of the effect of enhancing dispersibility and abrasion speed cannot be expected. From the standpoint of waste water disposal, the anionic surfactant is preferably incorporated in the slurry in a small amount.

Nonionic Surfactant:

Examples of the nonionic surfactant employable herein include polyoxyethylene alkyl ether, polyoxyethylene alkyl phenyl ether, pullonic nonionic surfactant (adduct of ethylene oxide and propylene oxide), aliphatic acid polyoxyethylene ester, aliphatic acid polyoxyethylene sorbitan ester, polyoxyethylene castor oil, aliphatic acid sucrose, and polyoxyethylene oxypropylene alkyl ether.

Specific examples of these nonionic surfactants include dilauric acid polyethylene glycol ester, tridecyl polyoxyethylene ether, nonylphenyl polyoxyethylene ether, and monostearic acid polyethylene glycol. Preferred among these nonionic surfactants are those having HLB of not less than 10.

The nonionic surfactant is incorporated in an amount of from 0.1 to 10% by weight.

Amphoteric Surfactant:

Examples of the amphoteric surfactant employable herein include N-alkylsulfobetaine-modified silicone oil, N-alkylnitrilotriacetic acid, N-alkyldimethylbetaine, $\alpha$-trimethylammonioaliphatic acid, N-alkyl-$\beta$-aminopropionic acid, N-alkyl-$\beta$-iminodipropionate, N-alkyloxymethyl-N,N-diethylbetaine, 2-alkylimidazoline derivative, and N-alkylsulfobetaine.

The amount of the nonionic surfactant or amphoteric surfactant, if used in combination with the anionic surfactant, is from 0.1 to 5 parts by weight based on 1 part by weight of the anionic surfactant. The combined use of the nonionic surfactant or amphoteric surfactant and the anionic surfactant makes it possible to enhance the holding stability of the slurry.

The content of the nonionic surfactant or amphoteric surfactant in the abrasive slurry is from 0.1 to 10% by weight, preferably from 0.1 to 5% by weight. If the content of the nonionic surfactant or amphoteric surfactant falls below 0.1% by weight, there is no effect of enhancing the holding stability of the abrasive slurry. Even if the content of the nonionic surfactant or amphoteric surfactant exceeds 10% by weight, further enhancement of dispersibility cannot be expected.

Abrasive Auxiliaries:

Besides the foregoing components (a), (b), (c) and (d) and aqueous dispersant, other abrasive auxiliaries may be incorporated in the slurry. Examples of these abrasive auxiliaries include dispersing aid, rust preventive, antifoaming agent, pH adjuster, and mildewproofing agent. Examples of the dispersing aid include sodium hexametaphosphate, oleic acid, and monobasic calcium phosphate. Examples of the pH adjuster include potassium hydroxide, sodium hydroxide, morpholine, and aqueous ammonia. Examples of the rust preventive include nitrogen-containing organic compounds such as alkanolamine-alkanolamine borate condensate, monoethanolamine, diethanolamine, triethanolamine, alkanolamine borate and benzisothiazoline. Examples of the anti-foaming agent include liquid paraffin, dimethyl silicone oil, mixture of monoglyceride stearate and diglyceride stearate, and sorbitan monopalmitate.

The present invention will be further described in the following examples.

EXAMPLE 1

0.5 parts by weight of aluminum nitrate were dissolved in 45 parts by weight of water which had passed through a 0.1 $\mu$m cartridge filter. Separately, 0.5 parts by weight of disodium ethylenediaminetetraacetate as a chelating agent were dissolved in 50 parts by weight of water which had passed through a 0.1 $\mu$m cartridge filter. The two solutions were then mixed. The mixture thus obtained was stored in a 23° C. constant temperature room for 1 to 5 days, and then measured for the amount of precipitate (transparent crystal).

The amount of the crystal based on the weight of the solution was as follows:

After 1 day: 0.008% by weight

After 2 days: 0.036% by weight

After 3 days: 0.125% by weight

After 4 days: 0.138% by weight

After 5 days: 0.140% by weight

After 5 days, the crystal was then removed from the solution by filtration.

93.5 parts by weight of the filtrate were then mixed with 2.5 parts by weight of a particulate aluminum oxide having an average particle diameter of 0.5 $\mu$m, 1.0 part by weight of lauryl alcohol polyoxy ethylene ether and 2.0 parts by weight of a polyethylene glycol (molecular weight: 300) by means of a homogenizer to prepare an abrasive slurry.

The abrasive slurry contains a hardly water-soluble chelate aluminum salt or chelate nickel salt causing scratch incorporated therein in a limited amount of not more than 0.1% by weight even after one month of holding after preparation.

Wf of a composite magnetic head was pressed against an abrasion pad stuck to an abrasion platen while the abrasive slurry thus obtained was being dropped thereonto. The abrasion was conducted under the following conditions.

Rotary speed of platen; 50 r.p.m.

Rotary speed of Wf: 50 r.p.m.

Wf pressure: 400 g/cm$^2$

Abrasion time: 2 minutes

The alumina and NiFe thus abraded were then evaluated for surface roughness per 1 $\mu$m square by means of AFM. As a result, both the alumina and NiFe exhibited Rmax of about 50 Å and Ra of about 6 Å.

Further, the difference in height between alumina and NiFe was 700 Å.

The surface of the alloy was then measured by means of a surface defect analyzer using laser beam to determine the number of scratches having a length of not more than 20 $\mu$m and a width of from 1 to 3 $\mu$m. As a result, no microscratches were found.

REFERENCE EXAMPLE 0.5 parts by weight of aluminum nitrate and 0.5 parts by weight of disodium ethylenediaminetetraacetate were dissolved in 95 parts by weight of water which had passed through a 0.1 $\mu$m cartridge filter. The solution thus obtained was stored in a 23° C. constant temperature room for 1 to 5 days to determine the amount of precipitate (transparent crystal).

After 1 day: 0.189% by weight

After 2 days: 0.190% by weight

After 3 days: 0.198% by weight

After 4 days: 0.203% by weight

After 5 days: 0.204% by weight

COMPARATIVE EXAMPLE 1

0.5 parts by weight of aluminum nitrate and 0.5 parts by weight of disodium ethylenediaminetetraacetate were dissolved in 93.5 parts by weight of water which had passed through a 0.1 pm cartridge filter. The solution was then mixed with 2.5 parts by weight of a particulate aluminum oxide having an average particle diameter of 0.5 $\mu$m, 1.0 part by weight of lauryl alcohol polyoxy ethylene ether and 2.0 parts by weight of a polyethylene glycol (molecular weight: 200) by means of a homogenizer to prepare an abrasive slurry.

The abrasive slurry thus obtained was then stored for 3 days before use.

A composite magnetic head was then abraded with the abrasive slurry thus obtained in the same manner as in Example 1. As a result, 3 scratches having a length of not less than 20 $\mu$m were found.

EXAMPLE 2

0.5 parts by weight of aluminum sulfate were dissolved in 45 parts by weight of water which had passed through a 0.1 $\mu$m cartridge filter. Separately, 0.5 parts by weight of sodium diethylenetriaminetepentaacetate as a chelating agent were dissolved in 50 parts by weight of water which had passed through a 0.1 $\mu$m cartridge filter. The two solutions were then mixed. The mixture thus obtained was stored in a 23° C. constant temperature room for 1 to 5 days, and then measured for the amount of precipitate (transparent crystal).

The amount of the crystal based on the weight of the solution was as follows:

After 1 day: 0.011% by weight

After 2 days: 0.052% by weight

After 3 days: 0.130% by weight

After 4 days: 0.150% by weight

After 5 days: 0.151% by weight

After 5 days, the crystal was then removed from the solution by filtration.

93.5 parts by weight of the filtrate were then mixed with 2.5 parts by weight of a particulate aluminum oxide having an average particle diameter of 0.5 $\mu$m, 1.0 part by weight of lauryl alcohol polyoxy ethylene ether and 2.0 parts by weight of a polyethylene glycol (molecular weight: 300) by means of a homogenizer to prepare an abrasive slurry.

The abrasive slurry thus obtained was then stored for 3 days before use.

The abrasive slurry contains a hardly water-soluble chelate aluminum salt or chelate nickel salt causing scratch incorporated therein in a limited amount of not more than 0.1% by weight even after one month of holding after preparation.

A composite magnetic head was then abraded with the abrasive slurry thus obtained in the same manner as in Example 1. AS a result, no scratches having a length of not less than 20 $\mu$m were found.

The abrasive slurry according to the present invention can satisfy the requirements for surface roughness of composite material and keep the difference in the level between different materials even when used in the leveling abrasion in the course of the formation of thin film magnetic head, particularly composite thin film magnetic head element.

Figure 1B:
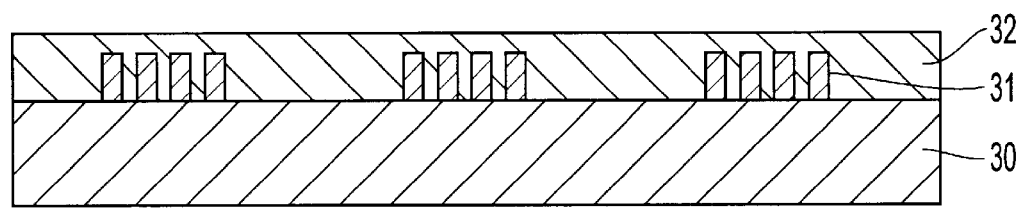

FIGS. 1A and 1B are cross sectional views showing an embodiment of flatting process of a multi-layered wiring of a semiconductor integrated circuit by using the abrasive slurry according to the present invention. As shown in FIG. 1A, an interlayer insulation layer 32 made of silicon oxidation layer is formed on a field oxidation layer 30 formed on a silicon substrate (not shown). A plurality of metal wiring patterns 31 are formed on the field oxidation layer 30. Convex portions 32a in the interlayer insulation layer 32 are formed above portions where the metal wiring patters are collected. FIG. 1B shows a condition that the surface of the interlayer insulation layer 32 has been flatted by using the abrasive slurry according to the present invention.

As apparent from FIG. 1B, according to the present invention, not only the convex portions 32a where the metal wirings are collected but also portions between the convex portions 32a are preciously flatted. Accordingly, there is no possibility of breaking a wiring layer (not shown) on the interlayer insulation layer and occurring trouble due to electromigration. Consequently, in the multilayer wiring structure of the semiconductor integrated circuit, the devices reliability and the manufacturing yield can be remarkably enhanced.

Figure 2A:
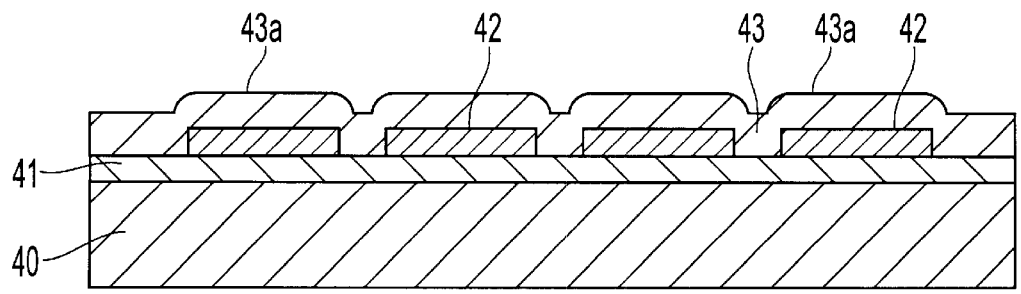
FIGS. 2A to 2C are cross sectional views showing an embodiment of flatting process of a shield layer of a thin film magnetic head and a pole tip of the magnetic pole of an upper magnetic pole.
Figure 2B:
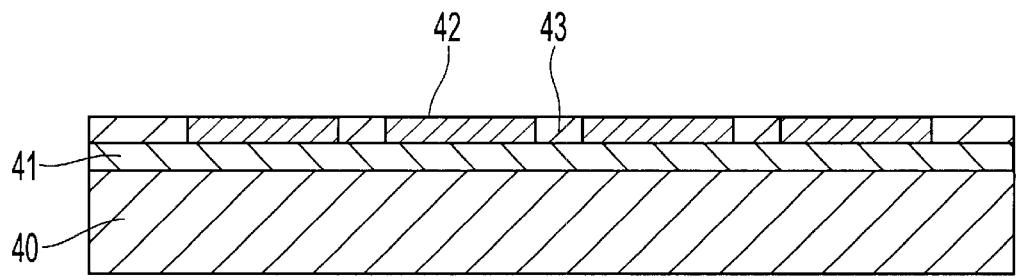
Figure 2C:
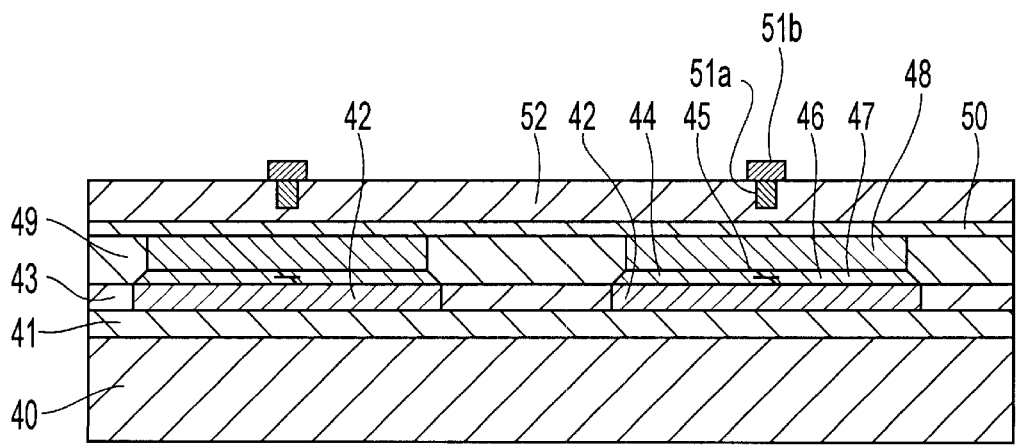

FIGS. 2A to 2C are cross sectional views showing an embodiment of flatting process of a shield layer of a thin film magnetic head and a pole tip of the magnetic pole of an upper magnetic pole. In FIG. 2A, an insulation layer 41 made of alumina is formed on a substrate 41 made of altic. A lower shield layer 42 for a read head made of a magnetic material such as Permalloy (NiFe) etc. is formed on the insulation layer 41. Thereafter, an insulation layer 43 made of alumina is formed on the lower shield layer 42. Convex portions 43a are formed in the insulation layer 43 above the lower shield layer 42.

In FIG. 2B, the surface of the insulation layer 43 has been flatted by the abrasive slurry according to the present invention. In this case, the surface of the thin magnetic head is abraded so that the lower shield layer 42 is exposed to the surface of the insulation layer 43.

Thereafter, as shown in FIG. 2C, a lower shield gap film 44, a magnetic resistance effect layer 45, a drawing electrode layer (lead wire) 46 connected to the magnetic resistance effect layer, an upper shield gap film 47, and an upper shield layer/lower magnetic pole 48 are formed. Then, an insulation layer 49 is once formed and the surface of the insulation layer 49 is abraded by the abrasive slurry according to the present invention. Further, a recording gap film 50 and a pole tip 51a are formed. Then, an insulation layer 52 made of alumina is formed, and thereafter, the insulation layer 52 is abraded. Finally, a thin film coil (not shown), an upper magnetic layer (top pole) 51b and an over coat layer (not shown) etc. are formed to complete the producing process of the thin film magnetic head.

Thus, while producing the thin film magnetic head, each of the insulation layers is abraded by the slurry according to the present invention. Therefore, the device's reliability and the manufacturing yield can be remarkably enhanced.

Incidentally, although the insulation layer is abraded in the above embodiment, the present invention is not limited thereto. For example, a magnetic layer can be abraded in the manner as described above.

What is claimed is:

1. A process for abrading a semiconductor integrated circuit, wherein while producing a layer structure of the semiconductor integrated circuit, at least one layer of said layer structure is abraded by an abrasive slurry comprising:

an aluminum grain having an average particle diameter of from 0.05 to 1 μm in an amount of from 0.1 to 10% by weight; an inorganic salt selected from the group consisting of water-soluble inorganic aluminum salt and nickel salt in an amount from 0.1 to 3% by weight; a water-soluble chelating agent in an amount from 0.1 to 3% by weight; and an abrasive oil in an amount from 0.1 to 10% by weight; wherein said abrasive slurry is water soluble and has a content of hardly water-soluble chelate aluminum salt or chelate nickel salt of not more than 0.1% by weight.

2. The process for abrading a semiconductor integrated circuit according to claim 1, wherein the layer structure includes at least one insulation layer which is abraded.

3. A process for abrading a magnetic thin film head, wherein while producing a layer structure of the magnetic thin film head, at least one layer is abraded by an abrasive slurry comprising: an aluminum grain having an average particle diameter of from 0.05 to 1 μm in an amount of from 0.1 to 10% by weight; an inorganic salt selected from the group consisting of water-soluble inorganic aluminum salt and nickel salt in an amount from 0.1 to 3% by weight; a water-soluble chelating agent in an amount from 0.1 to 3% by weight; and an abrasive oil in an amount from 0.1 to 10% by weight; wherein said abrasive slurry is water soluble and has a content of hardly water-soluble chelate aluminum salt or chelate nickel salt of not more than 0.1% by weight.

4. The process for abrading a semiconductor integrated circuit according to claim 3, wherein at least one insulation layer is abraded.

5. A process for abrading a thin film abraded by an abrasive slurry comprising: an aluminum grain having an average particle diameter of from 0.05 to 1 μm in an amount of from 0.1 to 10% by weight; an inorganic salt selected from the group consisting of water-soluble inorganic aluminum salt and nickel salt in an amount from 0.1 to 3% by weight; a water-soluble chelating agent in an amount from 0.1 to 3% by weight; and an abrasive oil in an amount from 0.1 to 10% by weight; wherein said abrasive slurry is water soluble and has a content of hardly water-soluble chelate aluminum salt or chelate nickel salt of not more than 0.1% by weight.

6. A process for preparation of an abrasive slurry, comprising the steps of:

preparing a first solution of at least one of inorganic salts selected from the group consisting of water-soluble inorganic aluminum salt and nickel salt and a second solution of water-soluble chelating agent;

mixing the first and second solutions;

holding the mixture of the first and second solutions to precipitate at least one hardly water-soluble crystal;

removing the at least one hardly water-soluble crystal from the mixture; and mixing the solution with an alumina grain having an average particle diameter from 0/05 to 1 μm, abrasive oil and a required amount of an aqueous dispersant.

7. The process of an abrasive slurry according to claim 6, wherein the mixture of the first and second solutions is held for 1 day or longer to precipitate at least one hardly water-soluble crystal.

8. The process for preparation of an abrasive slurry according to claim 6, wherein an inorganic salt used to form the inorganic salt solution is at least one of inorganic salts selected from the group consisting of nitrate, hydrochloride, sulfate, phosphate and thiosulfate of aluminum and nickel.

9. The process for the preparation of an abrasive slurry according to claim 6, wherein an inorganic salt used to form the inorganic salt solution is aluminum nitrate.

10. The process for the preparation of an abrasive slurry according to claim 6, wherein said chelating agent is disodium ethylenediaminetetraacetate or sodium ethylenetriamine pentaacetate.

11. The process for preparation of an abrasive slurry according to claim 6, wherein said abrasive oil is at least one of abrasive oils selected from the group consisting of polyoxyethylene alkyl ether, polyoxyethylene alkyl phenyl ether, pullonic nonionic surfactant (addition product of ethylene oxide and propylene oxide), aliphatic acid polyoxyethylene ester, polyoxyethylene oxypropylene alkyl ether, ethylene glycol, tetramethylene glycol, diethylene glycol, propylene glycol and polyethylene glycol.

12. An abrasive slurry comprising:

an alumina grain having an average particle diameter of from 0.05 to 1 μ in an amount of from 0.1 to 10% by weight;

an inorganic salt selected from the group consisting of water-soluble inorganic aluminum salt and nickel salt in an amount of from 0.1 to 3% by weight;

a water-soluble chelating agent in an amount of from 0.1 to 3% by weight;

an abrasive oil in an amount of from 0.1 to 10% by weight; and a hardly water-soluble chelate aluminum salt or chelate nickel salt of not more than 0.1% by weight.

* * * * *